United States Patent
Song

(10) Patent No.: US 9,857,426 B2
(45) Date of Patent: Jan. 2, 2018

(54) TEST-USED PRINTED CIRCUIT BOARD HAVING IN-SERIES CIRCUIT INVOLVED WITH JOIN TEST ACTION GROUP SIGNAL

(71) Applicants: Inventec (Pudong) Technology Corporation, Shanghai (CN); Inventec Corporation, Taipei (TW)

(72) Inventor: Ping Song, Shanghai (CN)

(73) Assignees: INVENTEC (PUDONG) TECHNOLOGY CORPORATION, Shanghai (CN); NVENTEC CORPORATION, Taipei (TW)

( * ) Notice: Subject to any disclaimer, the term of this patent is extended or adjusted under 35 U.S.C. 154(b) by 44 days.

(21) Appl. No.: 15/073,599

(22) Filed: Mar. 17, 2016

(65) Prior Publication Data

US 2017/0184672 A1 Jun. 29, 2017

(30) Foreign Application Priority Data

Dec. 25, 2015 (CN) .......................... 2015 1 0995951

(51) Int. Cl.
*G01R 31/3177* (2006.01)
*G01R 31/317* (2006.01)
*G06F 11/22* (2006.01)
*G01R 31/3185* (2006.01)

(52) U.S. Cl.
CPC ... *G01R 31/3177* (2013.01); *G01R 31/31723* (2013.01); *G06F 11/22* (2013.01); *G01R 31/318555* (2013.01)

(58) Field of Classification Search
CPC ..... G06F 11/26; G06F 11/25; G01R 31/3177; G01R 31/31723; G01R 31/318555; G01R 31/318572
See application file for complete search history.

(56) References Cited

U.S. PATENT DOCUMENTS 7,447,962 B2 * 11/2008 Horie ............... G01R 31/31855
714/726
2014/0298125 A1 * 10/2014 Devadze ................. G06F 11/26
714/726

* cited by examiner

*Primary Examiner* — Shelly A Chase
(74) *Attorney, Agent, or Firm* — David R. Stevens; Stevens Law Group

(57) ABSTRACT

A test-used PCB having an in-series circuit involved with a join test action group (JTAG) signal is provided. A first JTAG connection interface and a second JTAG connection interface are configured on test circuit boards. Test circuit boards can be seriously connected with each other through the first JTAG connection interface and the second JTAG connection interface. Therefore, the efficiency of providing series test circuit boards, reducing TAP controller and JTAG port may be achieved.

9 Claims, 3 Drawing Sheets

TEST-USED PRINTED CIRCUIT BOARD HAVING IN-SERIES CIRCUIT INVOLVED WITH JOIN TEST ACTION GROUP SIGNAL

CROSS-REFERENCE TO RELATED APPLICATION

This application claims the benefit of Chinese Patent Application No. 201510995951.1, filed Dec. 25, 2015.

BACKGROUND OF THE RELATED ART

Technical Field

The present invention relates to a test-used printed circuit board (PCB), and particularly to a test-used PCB having an in-series circuit involved with a join test action group (JTAG) signal.

Prior Art

For currently available test methods for slots, such as a memory slot and a peripheral component interconnect express (PCIE), a test-used printed circuit board (PCB) adopting a boundary scan technology is widely used.

However, when a test-used PCB is used, it has be correspondingly electrically connected to a joint test action group (JTAG) of a test access port (TAP). When a large of amounts of slots, such as a memory slot and a PCI (peripheral component interconnect) express slot, have to be concurrently tested, the JTAG ports of the TAP controller have to be largely used. However, since the number of the JTAG ports provided by the TAP is limited, the test for the memory slots and the PCI express slots may not be undertaken concurrently.

Although the number of the JTAG ports to be tested may be promoted by using an extension board of the TAP, the test-used PCB and the JTAG port of the TAP may involve a complexity and a confused corresponding relationship.

In view of the above, there have long been the issues of complexity and inconvenience for the slots on the PCB to be tested. Therefore, there is a need to set forth an improvement means to settle down this problem.

SUMMARY

In view of the issues of complexity and inconvenience for slots on a printed circuit board (PCB) to be tested encountered in the prior art, the present invention provides a test-used PCB having an in-series circuit involved with a JTAG signal.

According to the present invention, the test-used PCB having an in-series circuit involved with the JTAG signal comprises a test-used PCB, and the test-used PCB comprises a first JTAG connective interface, a second JTAG connective interface, and at least a JTAG control chip.

The first JTAG connective interface, the first joint test action group connective interface further comprising a first interface test clock (test clock, TCK) pin, a first interface test mode select (TMS) pin, a first interface test data (TDI) pin and a first interface test data out (TDO) pin.

The second JTAG connective interface, the second JTAG connective interface further comprises a second TCK pin, a second interface TMS pin, a second interface TDI, and a second interface test TDO.

The JTAG control chip, the JTAG control chip further comprises a chip TCK pin, a chip TMS pin, a chip TDI, and a chip TDO.

Wherein, the first and second interface TCK pins and the chip TCK pin are electrically connected, the first and second interface TMS pins and the chip TMS pin are electrically connected, the first interface TDI pin is electrically connected to the chip TDI of one of the JTAG control chips, the chip TDI pin is electrically connected to the chip TDO pin of one of the JTAG control chips, or the chip TDO pin is electrically connected to the second interface TDI pin, and the first interface TDO pin is electrically connected to the second interface TDO pin.

The system and method of the present invention has the difference as compared to the prior art that the test-used PCB has the first and second JTAG connective interfaces, through which over one test-used PCB may be connected in series, whereby a plurality of test-used PCBs may be connected in-series onto a JTAG port of a test access port (TAP) controller, to reduce the requirement of the TAP controllers and the JTAG port.

BRIEF DESCRIPTION OF THE DRAWINGS

The present invention will be better understood from the following detailed descriptions of the preferred embodiments according to the present invention, taken in conjunction with the accompanying drawings, in which.

DETAILED DESCRIPTION

The present invention will be apparent from the following detailed description, which proceeds with reference to the accompanying drawings, wherein the same references relate to the same elements.

Figure 1:
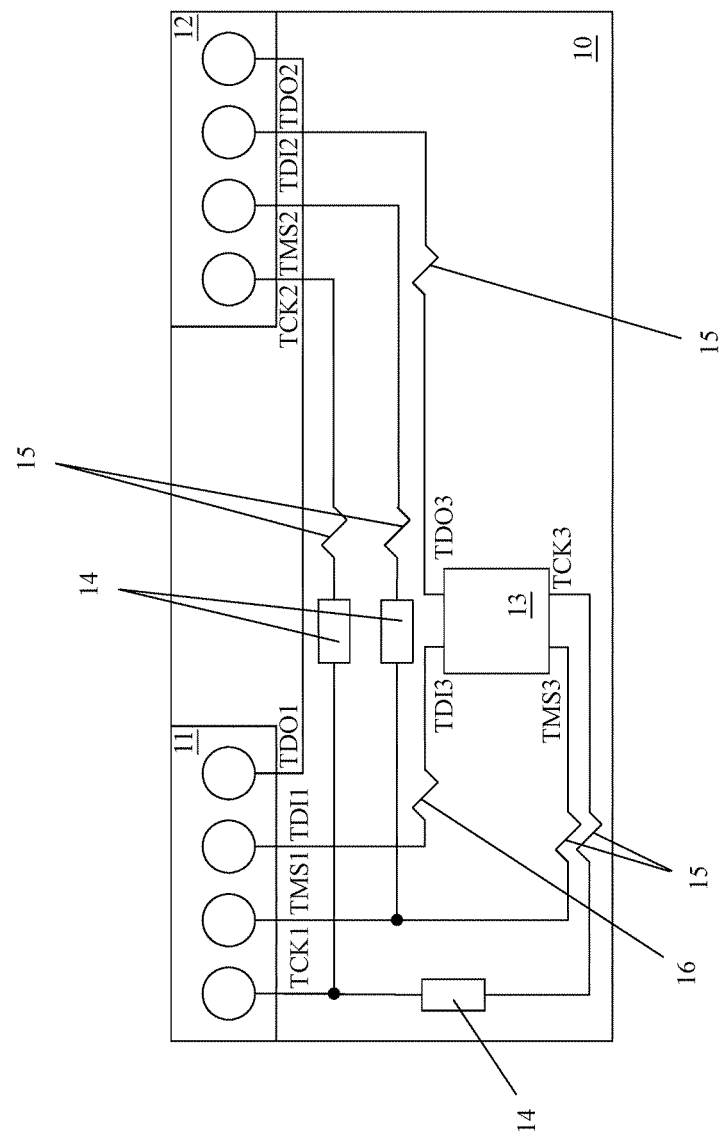
FIG. 1 depicts a schematic diagram of a test-used printed circuit board (PCB) having an in-series circuit involved with a join test action group (JTAG) signal according to a first embodiment of the present invention.

In the following, a first embodiment is set forth to explain how a test-used printed circuit board (PCB) having an in-series circuit involved with a join test action group (JTAG) signal according to the present invention is operated, with FIG. 1 referred to simultaneously, wherein FIG. 1 depicts a schematic diagram of the PCB having the in-series circuit involved with the JTAG signal according to the first embodiment of the present invention.

In this embodiment, the test-used PCB having the in-series circuit involved with the JTAG signal according to the present invention comprises the test-used PCB 10. The test-used PCB 10 further comprises a first JTAG connective interface 11, a second JTAG connective interface 12, and a JTAG control chip 13. A first embodied aspect is only having a single JTAG control chip 13.

The first JTAG connective interface 11 further comprises a first test clock (TCK) pin TCK1, a first interface test mode select (TMS) pin TMS1, a first interface test data in (TDI) pin TDI1, and a first interface test data out (TDO) pin TDO1.

The second JTAG connective interface 12 further comprises a second TCK pin TCK2, a first interface TMS pin TMS1, a first interface TDI pin TDI1, and a first interface TDO pin TDO2.

The JTAG control chip 13 further comprises a chip test clock pin TCK3, a chip test mode select pin TMS3, a chip test data pin TDI3, and a chip test data out pin TDO3.

The first interface TCK pin TCK1, the second interface clock pin TCK2 and the chip test clock pin TCK3 are electrically connected through a buffer chip 14 and a match resistor 15, to promote a signal in quality.

The first and second interface TMS pins TMS1, TMS2 are electrically connected through the buffer chip 14 and the match resistor 15, to promote the signal in quality.

The first interface TDI pin TDI1 and the chip TDI pin TDI3 of the JTAG control chip 13 are electrically connected through pull-up resistor 16. The chip TDO pin TDO3 and the second interface TDI pin TDI2 are electrically connected through the math resistor 15, to promote the signal in quality. The first interface TDO pin TDO1 and the second interface TDO pin TDO2 are electrically connected.

It is to be noted that a sequence of the first interface TCK pin TCK1, the first interface TMS pin TMS1, the first interface TDI pin TDI1 and the first interface TDO pin TDO1 of the first JTAG connective interface 11 and a sequence of the second interface TCK pin TCK2, the second interface TMS pin TMS2, the second interface TDI pin TDI2 and the second interface TDO pin TDO2 of the second JTAG connective interface 12 are the same.

In this manner, two test-used PCBs 10 are connected in series through the first JTAG connective interface 11 and second JTAG connective interface 12, so that a plurality of test-used PCBs 10 may be connected in series to a JATG port of a test access port (TAP) controller, to reduce a requirement of the TAP controller and the JTAG port.

Figure 2:
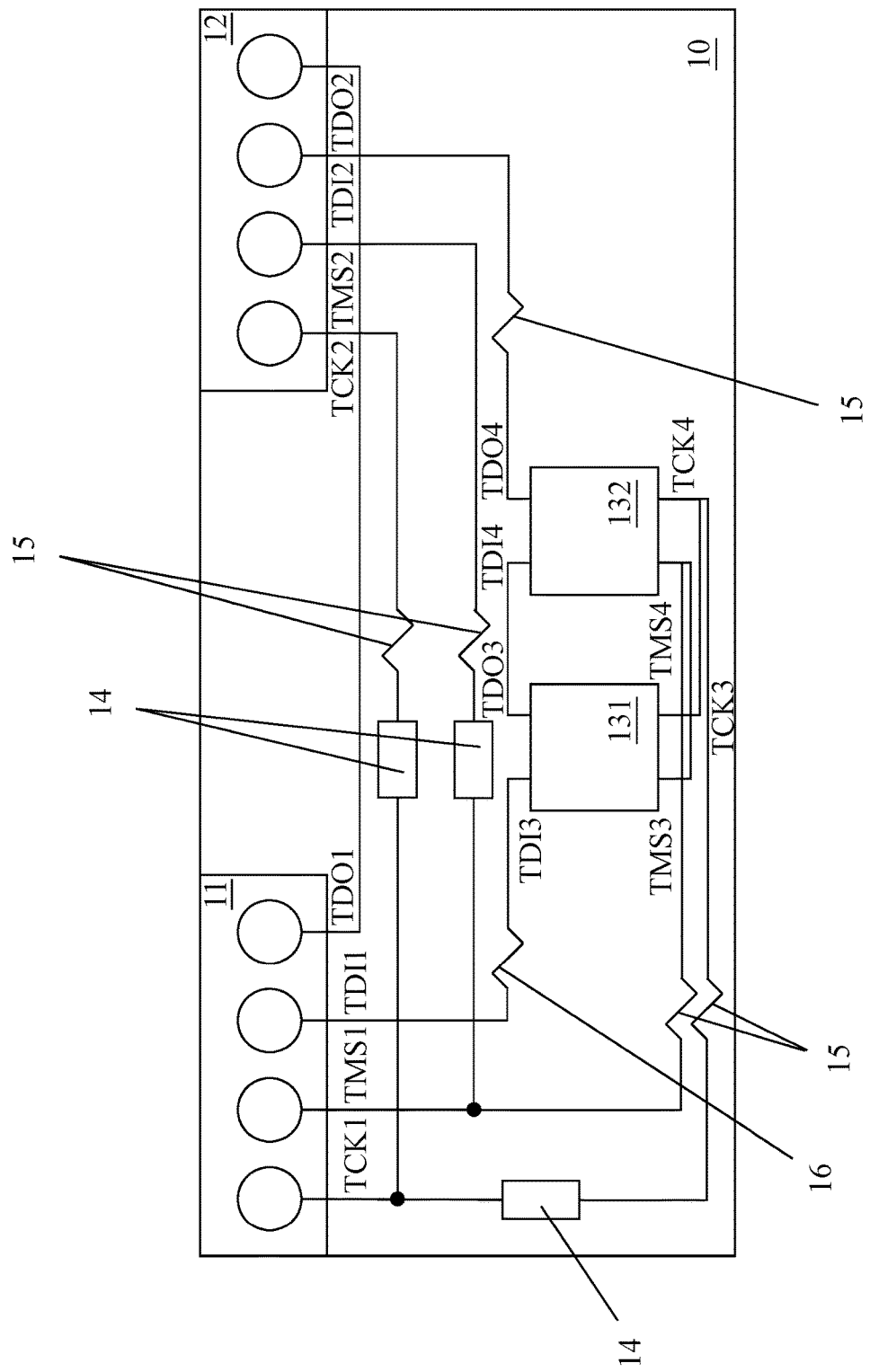
FIG. 2 depicts a schematic diagram of a test-used PCB having the in-series circuit involved with the JTAG signal according to a first embodiment of the present invention.

In the following, a second embodiment is set forth to explain how the test-used PCB having the in-series circuit involved with the JTAG signal according to the present invention is operated, with FIG. 2 referred to simultaneously, wherein FIG. 2 depicts a schematic diagram of the PCB having the in-series circuit involved with the JTAG signal according to the second embodiment of the present invention.

In this embodiment, the PCB having the in-series circuit involved with the JTAG signal according to the present invention comprises the test-used PCB 10. The test-used PCB 10 further comprises a first JTAG connective interface 11, a second JTAG connective interface 12, and a first JTAG control chip 131 and a second JTAG control chip 132. The second embodied aspect is set forth by having only two JTAG control chips. Further, over two JTAG control chips may be deduced based on this embodied aspect, which is omitted herein for clarity.

The first JTAG connective interface 11 further comprises a first test clock (TCK) pin TCK1, a first interface test mode select (TMS) pin TMS1, a first interface test data in (TDI) pin TDI1, and a first interface test data out (TDO) pin TDO1.

The second JTAG connective interface 12 further comprises a second TCK pin TCK2, a first interface TMS pin TMS2, a first interface TDI pin TDI2, and a first interface TDO pin TDO2.

The first JTAG control chip 131 further comprises a chip test clock pin TCK3, a chip test mode select pin TMS3, a chip test data pin TDI3, and a chip test data out pin TDO3.

The second JTAG control chip 132 further comprises a chip test clock pin TCK4, a chip test mode select pin TMS4, a chip test data pin TDI4, and a chip test data out pin TDO4.

The first interface TMS pin TMS1, the second interface TMS TMS2 are electrically connected through a buffer chip 14 and a match resistor 15, to promote a signal in quality. The first and second interface TMS pins TMS1, TMS2 are electrically connected through the match resistor 15, to promote the signal in quality. The chip TMS pin TMS3 and the chip TMS pin TMS4 are directly electrically connected.

The first interface TDI pin TDI1 and the chip TDI pin TDI3 of the JTAG control chip 131 are electrically connected through the pull-up resistor 16. The chip TDO pin TDO3 and the chip TDI pin TDI4 of the second JTAG control chip 132 are directly electrically connected. The chip TDO pin TDO4 of the second JTAG control chip 132 are electrically connected to through the match resistor 15, to promote the signal in quality. The first interface TDO pin TDO1 and the second interface TDO pin TDO2 are directly electrically connected.

It is to be noted that a sequence of the first interface TCK pin TCK1, the first interface TMS pin TMS1, the first interface TDI pin TDI1 and the first interface TDO pin TDO1 of the first JTAG connective interface 11 and a sequence of the second interface TCK pin TCK2, the second interface TMS pin TMS2, the second interface TDI pin TDI2 and the second interface TDO pin TDO2 of the second JTAG connective interface 12 are the same.

In this manner, two test-used PCBs 10 are connected in series through the first JTAG connective interface 11 and second JTAG connective interface 12, so that a plurality of test-used PCBs 10 may be connected in series to a JATG port of a TAP controller, to reduce a requirement of the TAP controller and the JTAG port.

Figure 3A:
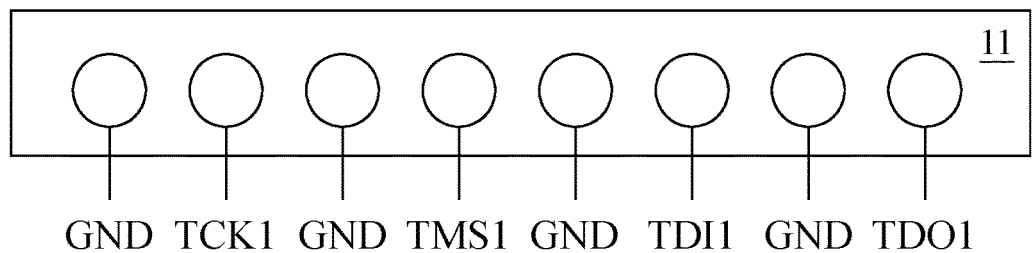
FIG. 3A and FIG. 3B depict a schematic diagram of a pin arrangement of the first and second JTAG connective interfaces of the test-used PCB having the in-series circuit involved with the JTAG signal according to the present invention, respectively.
Figure 3A:
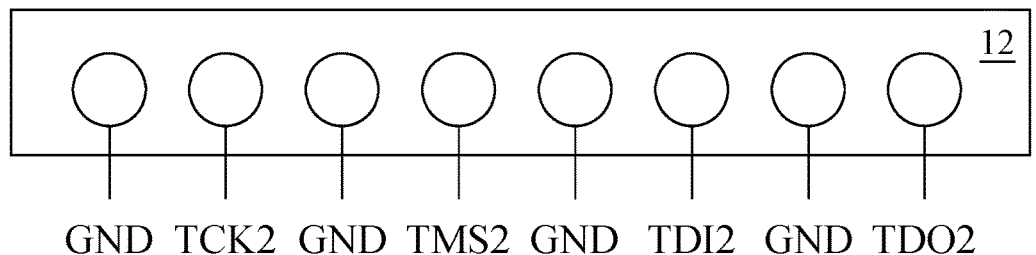
Figure 3B:
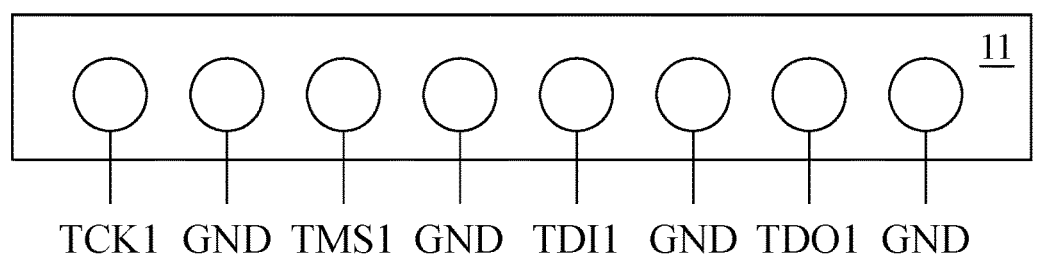
Figure 3B:
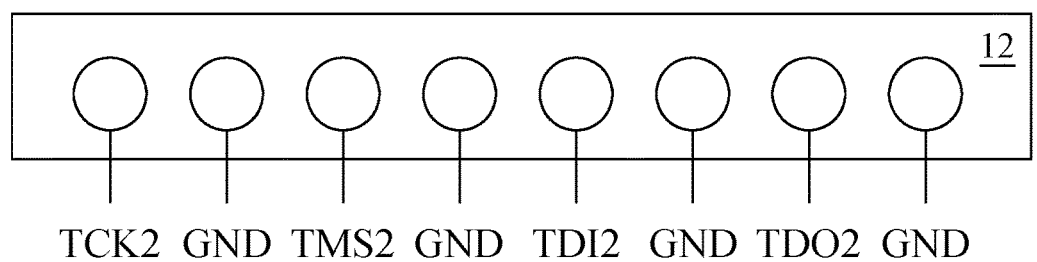

In addition, with reference to FIG. 3A and FIG. 3B, wherein FIG. 3A and FIG. 3B depict a schematic diagram of a pin arrangement of the first and second JTAG connective interfaces of the test-used PCB having the in-series circuit involved with the JTAG signal according to the present invention, respectively.

The schematic diagram of the first JTAG connective interface 11 and the schematic diagram of the second JTAG connective interface 12 can be used to the first embodiment and the second embodiment.

The first JTAG connective interface 11 further comprises ground pins GND corresponded and staggered with the first interface TCK pin TCK1, the first interface TMS pin TMS1, the first interface TDI pin TDI1 and the first interface TDO pin TDO1. The ground pin GND is used to promote an EMI capability of the first interface TCK pin TCK1, the first interface TMS pin TMS1, the first interface TDI pin TDI1 and the first interface TDO pin TDO1.

The second JTAG connective interface 12 further comprises ground pins GND corresponded and staggered with the second interface TCK pin TCK2, the second interface TMS pin TMS2, the second interface TDI pin TDI2 and the second interface TDO pin TDO2. The ground pin GND is used to promote an EMI capability of the second interface TCK pin TCK2, the second interface TMS pin TMS2, the second interface TDI pin TDI2 and the second interface TDO pin TDO2.

In addition, a sequence of the first interface TCK pin TCK1, the first interface TMS pin TMS1, the first interface TDI pin TDI1 and the first interface TDO pin TDO1 and the ground pins GND and a sequence of the second interface TCK pin TCK2, the second interface TMS pin TMS2, the second interface TDI pin TDI2 and the second interface TDO pin TDO2 and ground pins GND are the same.

In this manner, two test-used PCBs 10 are connected in series through the first JTAG connective interface 11 and second JTAG connective interface 12, so that a plurality of test-used PCBs 10 may be connected in series to a JATG port of a TAP controller, to reduce a requirement of the TAP controller and the JTAG port.

In summary, the present invention has the technical difference as compared to the prior art that the test-used PCB has the first and second JTAG connective interfaces, through which over one test-used PCB may be connected in series, whereby a plurality of test-used PCBs may be connected in-series onto a JTAG port of a TAP controller, to reduce the requirement of the TAP controller and the JTAG port.

By using the technical means, the issues encountered in the prior art that the complexity and inconvenience issues on the test-used PCB to be tested may be solved, to further achieve in the technical efficacy where the requirement of the TAP controllers and the JTAG ports may be reduced.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A test-used printed circuit board (PCB) having an in-series circuit involved with a join test action group (JTAG) signal, comprising:
   a first JTAG connective interface, the first JTAG connective interface further comprising a first interface test clock (test clock, TCK) pin, a first interface test mode select (TMS) pin, a first interface test data (TDI) pin and a first interface test data out (TDO) pin;
   a second JTAG connective interface, the second JTAG connective interface further comprises a second TCK pin, a second interface TMS pin, a second interface TDI, and a second interface test TDO; and
   at least a JTAG control chip, the JTAG control chip further comprises a chip TCK pin, a chip TMS pin, a chip TDI, and a chip TDO;
   wherein the first and second interface TCK pins and the chip TCK pin are electrically connected, the first and second interface TMS pins and the chip TMS pin are electrically connected, the first interface TDI pin is electrically connected to the chip TDI of one of the JTAG control chips, the chip TDO pin is electrically connected to the chip TDI pin of one of the JTAG control chips, or the chip TDO pin is electrically connected to the second interface TDI pin, and the first interface TDO pin is electrically connected to the second interface TDO pin.

2. The test-used PCB having the in-series circuit involved with the JTAG signal as claimed in claim 1, wherein a sequence of the first interface TCK pin, the first interface TMS pin, the first TDI pin and the first interface TDO pin and a sequence of the second interface TCK pin, the second interface TMS pin, the second TDI pin and the second interface TDO pin are the same.

3. The test-used PCB having the in-series circuit involved with the JTAG signal as claimed in claim 1, wherein the first and second interface TCK pins and the chip TCK pins are electrically connected through a buffer chip and a match resistor.

4. The test-used PCB having the in-series circuit involved with the JTAG signal as claimed in claim 1, wherein the first and second interface TMS pins are electrically connected through a buffer chip and a match resistor, and the first interface TMS pin and the chip TMS pin are electrically connected through the match resistor.

5. The test-used PCB having the in-series circuit involved with the JTAG signal as claimed in claim 1, wherein the first interface TDI pin is electrically connected through a pull-up resistor to the chip TDI pin of one of the JTAG control chips.

6. The test-used PCB having the in-series circuit involved with the JTAG signal as claimed in claim 1, wherein the chip TDO pin is electrically connected through a match resistor to the second interface TDI pin.

7. The test-used PCB having the in-series circuit involved with the JTAG signal as claimed in claim 1, wherein the first JTAG connective interface further comprises ground pins corresponded and staggered with the first interface TCK pin, the first interface TMS pin, the first interface TDI pin and the first interface TDO pin respectively.

8. The test-used PCB having the in-series circuit involved with the JTAG signal as claimed in claim 7, wherein the second JTAG connective interface further comprises ground pins corresponded and staggered with the second interface TCK pin, the second interface TMS pin, the second interface TDI pin and the second interface TDO pin respectively.

9. The test-used PCB having the in-series circuit involved with the JTAG signal as claimed in claim 8, wherein a sequence of the first interface TCK pin, the first interface TMS pin, the first interface TDI pin, the first interface TDO pin and the ground pins and a sequence of a second order sequence of the second interface TCK pin, the second interface TMS pin, the second interface TDI pin, the second interface TDO pin and the ground pins are the same.

* * * * *